United States Patent
Shi et al.

(10) Patent No.: US 9,705,104 B2
(45) Date of Patent: Jul. 11, 2017

(54) OLED DISPLAY SUBSTRATE AND MANUFACTURE METHOD THEREOF

(71) Applicant: Shenzhen China Star Optoelectronics Technology Co., Ltd., Shenzhen, Guangdong (CN)

(72) Inventors: Longqiang Shi, Guangdong (CN); Yawei Liu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 86 days.

(21) Appl. No.: 14/424,425

(22) PCT Filed: Feb. 9, 2015

(86) PCT No.: PCT/CN2015/072493
§ 371 (c)(1),
(2) Date: Feb. 26, 2015

(87) PCT Pub. No.: WO2016/095330
PCT Pub. Date: Jun. 23, 2016

(65) Prior Publication Data
US 2016/0343784 A1  Nov. 24, 2016

(30) Foreign Application Priority Data
Dec. 16, 2014 (CN) .......................... 2014 1 0782725

(51) Int. Cl.
*H01L 51/52* (2006.01)
*H01L 51/56* (2006.01)
(Continued)

(52) U.S. Cl.
CPC ........ *H01L 51/5203* (2013.01); *H01L 27/326* (2013.01); *H01L 27/3248* (2013.01);
(Continued)

(58) Field of Classification Search
None
See application file for complete search history.

(56) References Cited

U.S. PATENT DOCUMENTS

2005/0110021 A1* 5/2005 Park ..................... H01L 27/3246
257/72
2005/0269946 A1* 12/2005 Jeong .................. H01L 51/5209
313/504
(Continued)

*Primary Examiner* — Joseph Schoenholtz
(74) *Attorney, Agent, or Firm* — Andrew C. Cheng

(57) ABSTRACT

The present invention provides an OLED display substrate and a manufacture method thereof. The OLED display substrate comprises a substrate (10), a TFT (90) located on the substrate (10), a passivation layer (50) located on the TFT (90), a flat layer (60) located on the passivation layer (50), a connecting electrode (80) being located on the flat layer (60) and contacting the TFT (90), an anode (70) being located on the flat layer (60) and covering the connecting electrode (80), an organic emitting layer (71) located on the anode (70) and a cathode (72) located on the organic emitting layer (71); the connecting electrode (80) contacts the TFT (90) via the contact hole (81) penetrating the flat layer (60) and the passivation layer (50); the anode (70) is electrically connected to the TFT (90) via the connecting electrode (80); the short circuit between the cathode and anode of the OLED display substrate can be prevented for avoiding the current concentration and ensuring the normal illumination of the OLED.

11 Claims, 3 Drawing Sheets

(51) Int. Cl.
*H01L 27/32* (2006.01)
*H01L 27/12* (2006.01)
(52) U.S. Cl.
CPC ...... *H01L 27/3262* (2013.01); *H01L 27/3276* (2013.01); *H01L 51/5209* (2013.01); *H01L 51/5212* (2013.01); *H01L 51/56* (2013.01); *H01L 27/1218* (2013.01); *H01L 27/1248* (2013.01); *H01L 27/1259* (2013.01); *H01L 27/3258* (2013.01); *H01L 2227/323* (2013.01)

(56) References Cited

U.S. PATENT DOCUMENTS

| | | | | |
|---|---|---|---|---|
| 2006/0006794 | A1* | 1/2006 | Sakakura | H01L 27/3248 313/503 |
| 2011/0210661 | A1* | 9/2011 | Nishi | H01L 27/3244 313/498 |
| 2014/0346445 | A1* | 11/2014 | Cho | H01L 51/5246 257/40 |
| 2015/0144904 | A1* | 5/2015 | Jeong | H01L 27/326 257/40 |
| 2015/0207094 | A1* | 7/2015 | Hwang | H01L 51/5203 257/88 |

\* cited by examiner

OLED DISPLAY SUBSTRATE AND MANUFACTURE METHOD THEREOF

FIELD OF THE INVENTION

The present invention relates to a display technology field, and more particularly to an OLED display substrate and a manufacture method thereof.

BACKGROUND OF THE INVENTION

At present, the practical applied display devices mainly comprise Cathode Ray Tube (CRT), Liquid Crystal Display (LCD), Vacuum fluorescent devices (VFD), Plasma Display Panel (PDP), Organic Light-Emitting Device (OLED), Field Emission Display (FED) and Light-Emitting Device (LED).LCD, OLED, etc, have been gradually replaced the CRT displays.

Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". It has been favored by respective big display makers and has become the main selection of the third generation display element.

Compared with the LCD display devices, the OLED display devices possess advantages of being thinner, lighter, wide view angle, active lighting, continuous adjustable light color, low cost, fast response, low power consumption, low driving voltage, wide usage temperature range, simple production process and high illuminating efficiency and possible flexible display, and the investment for the production equipments is far smaller than the LCD. The OLED has earned the great attention of the industry and the scientific community due to its incomparable advantages and beautiful application prospect than other displays.

The OLED can be categorized into two major types according to the driving methods, which are the Passive Matrix OLED and the Active Matrix OLED, i.e. the direct addressing and the Thin Film Transistor (TFT) matrix addressing.

As shown in FIG. 1, the present Active Matrix OLED display substrate comprises a substrate 100, a TFT located on the substrate 100, a passivation layer 300 located on the TFT layer, a flat layer 400 located on the passivation layer 300, an anode 500 located on the flat layer 400, an organic emitting layer 600 located on the anode 500 and a cathode (not shown) located on the organic emitting layer 600. A electrode hole 700 is above a drain 200 of the TFT and penetrates the flat layer 400 and the passivation layer 300 to expose a partial surface of the drain 200. The anode 500 is recessed at the electrode hole 700 to contact the drain 200 for receiving driving signals and controlling the lighting of the OLED. However, as manufacturing the organic emitting layer 600 on the anode 500, the organic emitting layer 600 on the recessed part of the anode 500 can be too thin or even cannot form thereon. If the manufacture of the cathode on the organic emitting layer 600 is proceeded, the short circuit between the cathode and the anode can happen very easily. The current concentration passing the short circuit can stop the current flow through the organic emitting layer 600 and cause issue incapable of lighting of the OLED.

SUMMARY OF THE INVENTION

An objective of the present invention is to provide an OLED display substrate capable of preventing the short circuit between the cathode and anode of the OLED display substrate to avoid the current concentration and ensuring the normal illumination of the OLED. Another objective of the present invention is to provide a manufacture method of an OLED display substrate, and the manufacture method is simple, the obtained OLED display substrate can prevent the short circuit between the cathode and anode of the OLED display substrate to avoid the current concentration and ensure the normal illumination of the OLED.

For realizing the aforesaid objectives, the present invention provides an OLED display substrate, comprising a substrate, a TFT located on the substrate, a passivation layer located on the TFT, a flat layer located on the passivation layer, a connecting electrode being located on the flat layer and contacting the TFT, an anode being located on the flat layer and covering the connecting electrode, an organic emitting layer located on the anode and a cathode located on the organic emitting layer;

the connecting electrode contacts the TFT with a contact hole penetrating the flat layer and the passivation layer;

the anode is electrically connected to the TFT via the connecting electrode.

The connecting electrode comprises a projecting part and a filling part; the projecting part is higher than the flat layer and covered by the anode to be electrically connected with the anode; the filling part fills in the contact hole and contacts the TFT to be electrically connected with the TFT.

Material of the connecting electrode is a stack combination of one or more of molybdenum, aluminum, titanium and copper.

The TFT comprises a buffer layer located on the substrate, a channel area and a semiconductor layer located in a source area and a drain area respectively at two sides of the channel area on the buffer layer, a gate isolation layer located on the semiconductor layer, a gate located above the channel area and on the gate isolation layer, an interlayer insulation layer on the gate, a source located in the source area and penetrating the gate isolation layer and the interlayer insulation layer and a drain located in the drain area and penetrating the gate isolation layer and the interlayer insulation layer.

The contact hole exposes a partial surface of the drain, and the filling part of the connecting electrode contacts the drain of the TFT via the contact hole, and electrically connected to the drain of the TFT.

The present invention further provides a manufacture method of an OLED display substrate, comprising steps of:

step 1, providing a substrate and forming a TFT on the substrate;

step 2, forming a passivation layer on the TFT, and forming a flat layer on the passivation layer;

step 3, patterning the flat layer and the passivation layer to form a contact hole penetrating the flat layer and the passivation layer;

step 4, deposing and patterning a connecting electrode on the flat layer, and the connecting electrode contacts the TFT with the contact hole;

step 5, forming an anode covering the connecting electrode on the flat layer;

step 6, sequentially forming an organic emitting layer on the anode, and forming a cathode on the organic emitting layer.

The step 1 comprises:

step 11, deposing a buffer layer on the substrate, and forming a channel area and a semiconductor layer located in a source area and a drain area respectively at two sides of the channel area on the buffer layer;

step 12, forming a gate isolation layer on the semiconductor layer, and forming a gate above the channel area and on the gate isolation layer, and deposing an interlayer insulation film on the gate and the gate isolation layer;

step 13, patterning the interlayer insulation film and the gate isolation layer to form via holes penetrating the interlayer insulation film and the gate isolation layer in positions corresponding to the source area and the drain area; forming a source and a drain on the interlayer insulation film, and the source and the drain respectively contact the source area and the drain area with the via holes.

The connecting electrode comprises a projecting part and a filling part; the projecting part is higher than the flat layer and covered by the anode to be electrically connected with the anode; the filling part fills in the contact hole and contacts the TFT to be electrically connected with the TFT.

In the step 3, the contact hole is formed at a position corresponding to the drain and exposes a partial surface of the drain.

Material of the connecting electrode is a stack combination of one or more of molybdenum, aluminum, titanium and copper.

The present invention further provides an OLED display substrate, comprising a substrate, a TFT located on the substrate, a passivation layer located on the TFT, a flat layer located on the passivation layer, a connecting electrode being located on the flat layer and contacting the TFT, an anode being located on the flat layer and covering the connecting electrode, an organic emitting layer located on the anode and a cathode located on the organic emitting layer;

the connecting electrode contacts the TFT with a contact hole penetrating the flat layer and the passivation layer;

the anode is electrically connected to the TFT via the connecting electrode;

wherein the connecting electrode comprises a projecting part and a filling part; the projecting part is higher than the flat layer and covered by the anode to be electrically connected with the anode; the filling part fills in the contact hole and contacts the TFT to be electrically connected with the TFT;

wherein material of the connecting electrode is a stack combination of one or more of molybdenum, aluminum, titanium and copper.

The benefits of the present invention are: the present invention provides an OLED display substrate and a manufacture method thereof. With the connecting electrode, the anode is electrically connected to the TFT via the connecting electrode, and it is different from prior art that the anode is electrically connected to the TFT via the recessed electrode hole and prevents the condition that the organic emitting layer is extremely thin on the recesses part of the anode or even cannot form thereon. Thus, it can prevent the short circuit between the cathode and anode of the OLED display substrate after locating the cathode on the organic emitting layer for avoiding the current concentration and ensuring the normal illumination of the OLED; meanwhile, the addition of the connecting electrode can improve the contact resistance between the anode and the drain of the TFT to promote the performance of the OLED display substrate.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
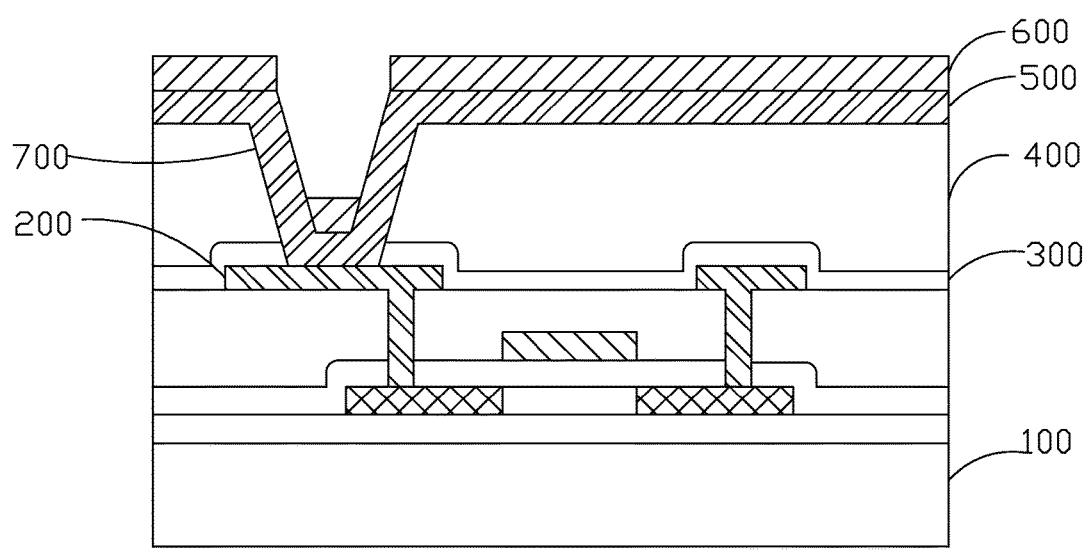
FIG. 1 is a sectional diagram of an OLED display substrate according to prior art.
Figure 2:
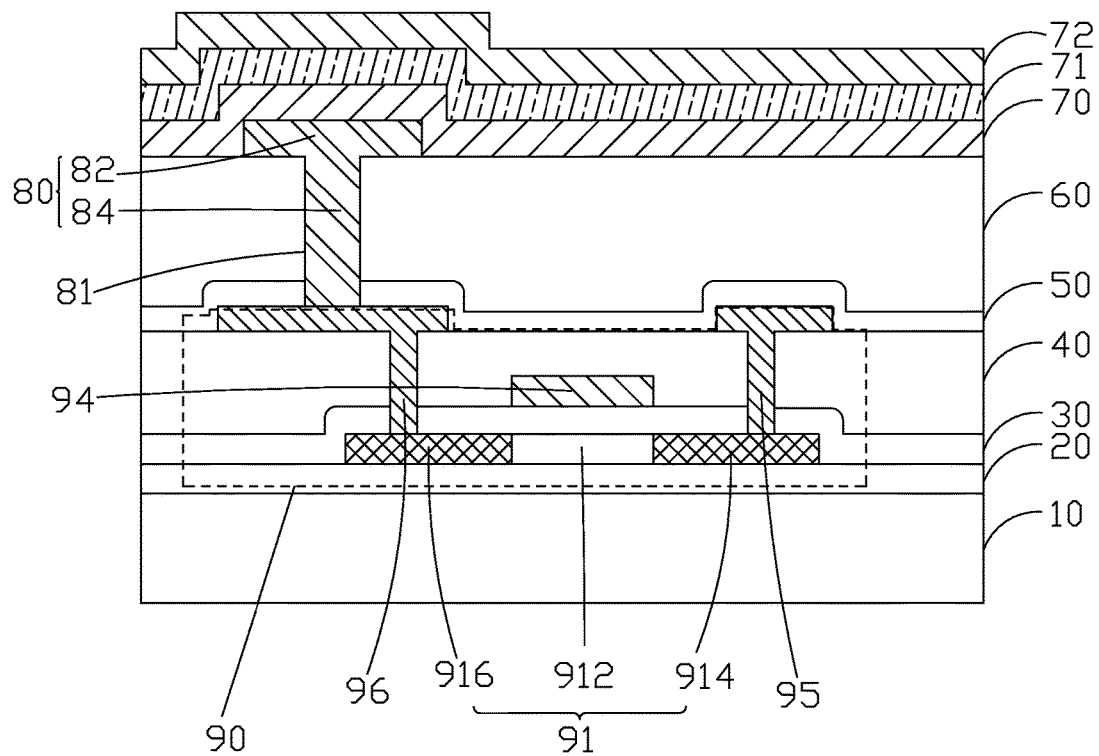
FIG. 2 is a sectional diagram of an OLED display substrate according to the present invention.

Please refer to FIG. 2. The present invention first provides an OLED display substrate, comprising:

a substrate 10, and the substrate 10 is a transparent substrate, and preferably, the substrate 10 is a glass substrate;

a TFT 90 located on the substrate 10; specifically, the TFT 90 comprises: a buffer layer 20 located on the substrate 10, a channel area 912 and a semiconductor layer 91 located in a source area 912 and a drain area 914 respectively at two sides of the channel area 912 on the buffer layer 20, a gate isolation layer 30 located on the semiconductor layer 91, a gate 94 located above the channel area 912 and on the gate isolation layer 30, an interlayer insulation layer 40 on the gate 94, a source 95 located in the source area 914 and penetrating the gate isolation layer 30 and the interlayer insulation layer 40 and a drain 96 located in the drain area 916 and penetrating the gate isolation layer 30 and the interlayer insulation layer 40;

a passivation layer 50 located on the TFT 90, and the passivation layer 50 can utilize an insulative film containing silicon as the material, which preferably can be a silicon nitride film or a silicon oxide film;

a flat layer 60 located on the passivation layer 50, and material of the flat layer 60 can be selected from organic resin films, such as a polyimide resin film, an acrylic resin film, etc. Alternatively, an inorganic film also can be the possible option;

a connecting electrode 80 being located on the flat layer 60 and contacting the TFT 90, and the connecting electrode 80 contacts the TFT 90 with a contact hole 81 penetrating the flat layer 60 and the passivation layer 50; material of the connecting electrode 80 is metal with well conductivity and preferably, is a stack combination of one or more of molybdenum, aluminum, titanium and copper;

an anode 70 being located on the flat layer 60 and covering the connecting electrode 80, and the anode 70 is electrically connected to the TFT 90 via the connecting electrode 80; the anode 70 is a transparent conductive film, such as an Indium Tin Oxide (ITO) conductive film, an Indium Zinc Oxide (IZO) conductive film, etc.;

an organic emitting layer 71 located on the anode 70, and the organic emitting layer 71 generally comprises a Hole Injection Layer (HIL), a Hole Transporting Layer (HTL), an emitting material layer (EML), an Electron Transport Layer (ETL) and an Electron Injection Layer (EIL);

and a cathode 72 located on the organic emitting layer 71.

Furthermore, the connecting electrode 80 comprises a projecting part 82 and a filling part 84; the projecting part 82 is higher than the flat layer 60 and covered by the anode 70 to be electrically connected with the anode 70; the filling part 84 fills in the contact hole 81 and contacts the TFT 90 to be electrically connected with the TFT 90. Accordingly, the anode 70 and the TFT 90 are connected via the connecting electrode 80.

In detail, the contact hole 81 exposes a partial surface of the drain 96, and the filling part 84 of the connecting electrode 80 contacts the drain of the TFT 90 via the contact hole 81, and electrically connected to the drain 96 of the TFT 90.

With the connecting electrode located 80 in the OLED display substrate of the present invention, the anode 70 is electrically connected to the TFT 90 via the connecting electrode 80, and it is different from prior art that the anode 70 is electrically connected to the TFT 90 via the recessed electrode hole and prevents the condition that the organic emitting layer is extremely thin on the recesses part of the anode or even cannot form thereon. The organic emitting layer 71 with continuous and even thickness on the anode 70 can be ensured. Thus, it can prevent the short circuit between the cathode 72 and the anode 70 of the OLED display substrate after locating the cathode 72 on the organic emitting layer 71 for avoiding the current concentration and ensuring the normal illumination of the OLED; meanwhile, the addition of the connecting electrode 80 can improve the contact resistance between the anode 70 and the drain 96 of the TFT 90 to promote the performance of the OLED display substrate.

Figure 3:
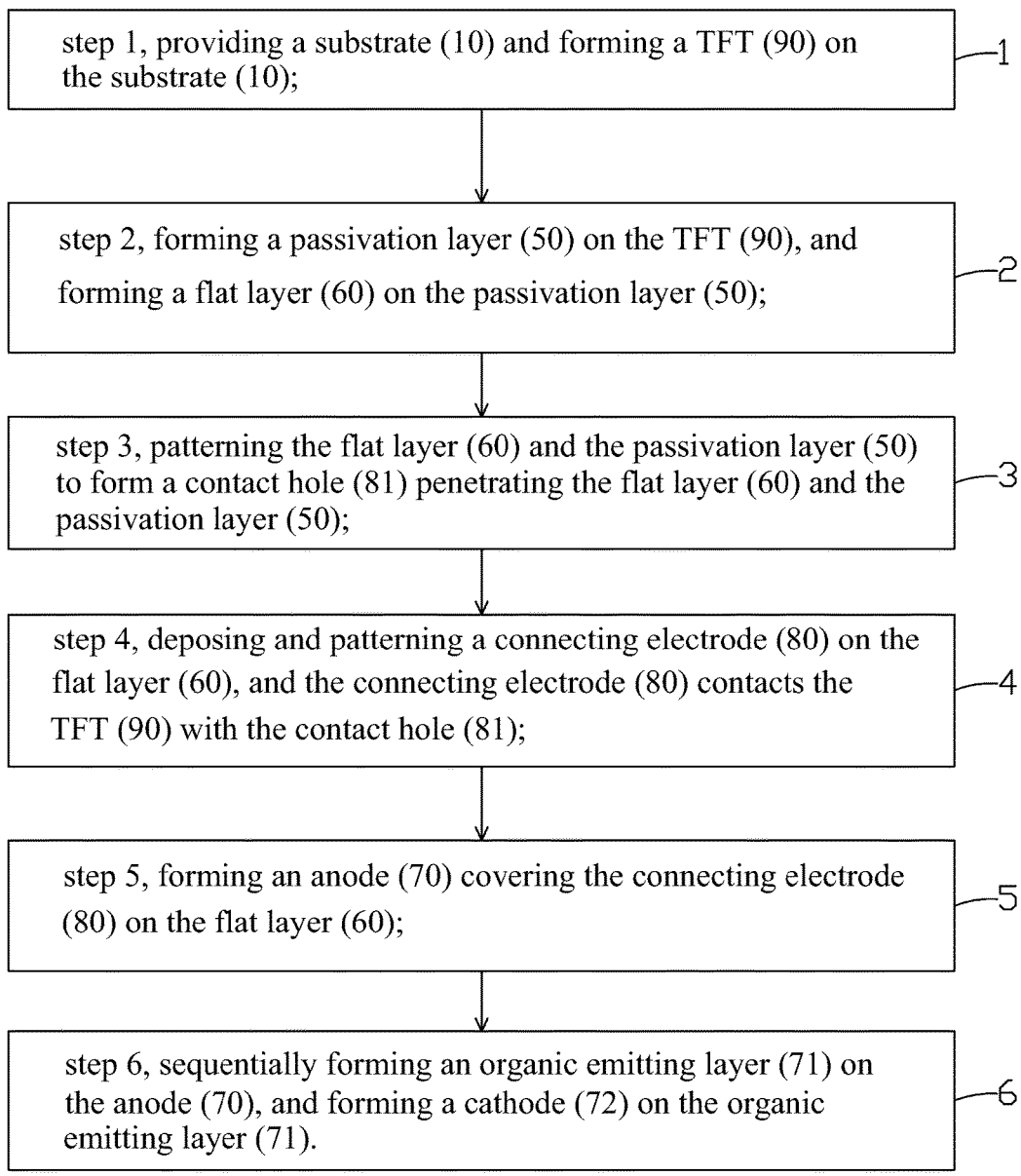
FIG. 3 is a flowchart of a manufacture method of an OLED display substrate according to the present invention.

Please refer to FIG. 3 in combination with FIG. 2. The present invention further provides a manufacture method of an OLED display substrate, comprising steps of:

step 1, providing a substrate 10 and forming a TFT 90 on the substrate 10.

Specifically, the step 1 comprises steps of:

step 11, deposing a buffer layer 20 on the substrate 10, and forming a channel area 912 and a semiconductor layer 91 located in a source area 914 and a drain area 916 respectively at two sides of the channel area 912 on the buffer layer 20;

step 12, forming a gate isolation layer 30 on the semiconductor layer 91, and forming a gate 94 above the channel area 912 and on the gate isolation layer 30, and deposing an interlayer insulation film 40 on the gate 94 and the gate isolation layer 30;

step 13, patterning the interlayer insulation film 40 and the gate isolation layer 30 to form via holes penetrating the interlayer insulation film 40 and the gate isolation layer 30 in positions corresponding to the source area 914 and the drain area 916; forming a source 95 and a drain 96 on the interlayer insulation film 40, and the source 95 and the drain 96 respectively contact the source area 914 and the drain area 916 with the via holes.

step 2, forming a passivation layer 50 on the TFT 90, and forming a flat layer 60 on the passivation layer 50.

step 3, patterning the flat layer 60 and the passivation layer 50 to form a contact hole 81 penetrating the flat layer 60 and the passivation layer 50.

Specifically, the passivation layer 50 can utilize an insulative film containing silicon as the material, which preferably can be a silicon nitride film or a silicon oxide film; material of the flat layer 60 can be selected from organic resin films, such as a polyimide resin film, an acrylic resin film, etc., and alternatively, an inorganic film also can be the possible option;

The contact hole 81 is formed at a position corresponding to the drain 96 and exposes a partial surface of the drain 96.

step 4, deposing and patterning a connecting electrode 80 on the flat layer 60, and the connecting electrode 80 contacts the TFT 90 with the contact hole 81.

Specifically, material of the connecting electrode 80 is metal with well conductivity and preferably, is a stack combination of one or more of molybdenum, aluminum, titanium and copper.

The connecting electrode 80 comprises a projecting part 82 and a filling part 84; the projecting part 82 is higher than the flat layer 60, and the filling part 84 fills in the contact hole 81 and contacts drain 96 of the TFT 90 to be electrically connected with the drain 96 of the TFT 90.

step 5, forming an anode 70 covering the connecting electrode 80 on the flat layer 60.

Specifically, the anode 70 covers the projecting part 82 of the connecting electrode 80 to be electrically connected with the connecting electrode 80. Thus, the anode 70 and the TFT 90 are connected via the connecting electrode 80.

The anode 70 is a transparent conductive film, such as an ITO conductive film, an IZO conductive film, etc.

step 6, sequentially forming an organic emitting layer 71 on the anode 70, and forming a cathode 72 on the organic emitting layer 71.

Specifically, the organic emitting layer 71 generally comprises a Hole Injection Layer, a Hole Transporting Layer, an emitting material layer, an Electron Transport Layer and an Electron Injection Layer.

Thus, the manufacture of the OLED display substrate is accomplished.

With the OLED display substrate manufactured by the aforesaid method, it can prevent the short circuit between the cathode 72 and the anode 70 for avoiding the current concentration and ensuring the normal illumination of the OLED; meanwhile, the contact resistance between the anode 70 and the drain 96 of the TFT 90 can be improved to promote the performance of the OLED display substrate.

In conclusion, the present invention provides an OLED display substrate and a manufacture method thereof. With the connecting electrode, the anode is electrically connected to the TFT via the connecting electrode, and it is different from prior art that the anode is electrically connected to the TFT via the recessed electrode hole and prevents the condition that the organic emitting layer is extremely thin on the recesses part of the anode or even cannot form thereon. Thus, it can prevent the short circuit between the cathode and anode of the OLED display substrate after locating the cathode on the organic emitting layer for avoiding the current concentration and ensuring the normal illumination of the OLED; meanwhile, the addition of the connecting electrode can improve the contact resistance between the anode and the drain of the TFT to promote the performance of the OLED display substrate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED display substrate, comprising a substrate, a TFT located on the substrate, a passivation layer located on the TFT, a flat layer located on the passivation layer, a connecting electrode being located on the flat layer and contacting the TFT, an anode being located on the flat layer and covering the connecting electrode, an organic emitting layer located on the anode and a cathode located on the organic emitting layer;

wherein the connecting electrode contacts the TFT with a contact hole penetrating the flat layer and the passivation layer;

wherein the anode is electrically connected to the TFT via the connecting electrode; and wherein the connecting electrode comprises a filling part that is received in and completely fills up the contact hole to be electrically connected with the TFT and a projecting part that is formed on a top surface of the flat layer such that a bottom surface of the projecting part is in contact with and supported on the top surface of the flat layer, the projecting part having a top surface spaced from the bottom surface thereof and a circumferential surface connected between the top and bottom surfaces thereof; the projecting part is located exactly under the anode that is laid directly on the top surface of the flat layer, the anode having a portion extending along and in direct contact with and covering the top surface and the circumferential surface of the projecting part of the connecting electrode so as to have the top surface and the circumferential surface of the projecting part of the connecting electrode completely covered and enclosed by the portion of the anode, while a remaining portion of the anode is located directly on the top surface of the flat layer.

2. The OLED display substrate according to claim 1, wherein material of the connecting electrode is a stack combination of one or more of molybdenum, aluminum, titanium and copper.

3. The OLED display substrate according to claim 1, wherein the TFT comprises a buffer layer located on the substrate, a channel area and a semiconductor layer located in a source area and a drain area respectively at two sides of the channel area on the buffer layer, a gate isolation layer located on the semiconductor layer, a gate located above the channel area and on the gate isolation layer, an interlayer insulation layer on the gate, a source located in the source and penetrating the gate isolation layer and the interlayer insulation layer and a drain located in the drain area and penetrating the gate isolation layer and the interlayer insulation layer.

4. The OLED display substrate according to claim 3, wherein the contact hole exposes a partial surface of the drain, and the filling part of the connecting electrode contacts the drain of the TFT via the contact hole, and electrically connected to the drain of the TFT.

5. A manufacture method of an OLED display substrate, comprising steps of:
step 1, providing a substrate and forming a TFT on the substrate;
step 2, forming a passivation layer on the TFT, and forming a flat layer on the passivation layer;
step 3, patterning the flat layer and the passivation layer to form a contact hole penetrating the flat layer and the passivation layer;
step 4, deposing and patterning a connecting electrode on the flat layer, and the connecting electrode contacts the TFT with the contact hole;
step 5, forming an anode covering the connecting electrode on the flat layer;

step 6, sequentially forming an organic emitting layer on the anode, and forming a cathode on the organic emitting layer;

wherein the connecting electrode comprises a filling part that is received in and completely fills up the contact hole to be electrically connected with the TFT and a projecting part that is formed on a top surface of the flat layer such that a bottom surface of the projecting part is in contact with and supported on the top surface of the flat layer, the projecting part having a top surface spaced from the bottom surface thereof and a circumferential surface connected between the top and bottom surfaces thereof; the projecting part is located exactly under the anode that is laid directly on the top surface of the flat layer, the anode having a portion extending along and in direct contact with and covering the top surface and the circumferential surface of the projecting part of the connecting electrode so as to have the top surface and the circumferential surface of the projecting part of the connecting electrode completely covered and enclosed by the portion of the anode, while a remaining portion of the anode is located directly on the top surface of the flat layer.

6. The manufacture method of the OLED display substrate according to claim 5, wherein the step 1 comprises:
step 11, deposing a buffer layer on the substrate, and forming a channel area and a semiconductor layer located in a source area and a drain area respectively at two sides of the channel area on the buffer layer;
step 12, forming a gate isolation layer on the semiconductor layer, and forming a gate above the channel area and on the gate isolation layer, and deposing an interlayer insulation film on the gate and the gate isolation layer;
step 13, patterning the interlayer insulation film and the gate isolation layer to form via holes penetrating the interlayer insulation film and the gate isolation layer in positions corresponding to the source area and the drain area; forming a source and a drain on the interlayer insulation film, and the source and the drain respectively contact the source area and the drain area with the via holes.

7. The manufacture method of the OLED display substrate according to claim 6, wherein in the step 3, the contact hole is formed at a position corresponding to the drain and exposes a partial surface of the drain.

8. The manufacture method of the OLED display substrate according to claim 5, wherein material of the connecting electrode is a stack combination of one or more of molybdenum, aluminum, titanium and copper.

9. An OLED display substrate, comprising a substrate, a TFT located on the substrate, a passivation layer located on the TFT, a flat layer located on the passivation layer, a connecting electrode being located on the flat layer and contacting the TFT, an anode being located on the flat layer and covering the connecting electrode, an organic emitting layer located on the anode and a cathode located on the organic emitting layer;

wherein the connecting electrode contacts the TFT with a contact hole penetrating the flat layer and the passivation layer;

wherein the anode is electrically connected to the TFT via the connecting electrode;

wherein the connecting electrode comprises a projecting part and a filling part; the projecting part is higher than the flat layer and covered by the anode to be electrically connected with the anode; the filling part fills in the contact hole and contacts the TFT to be electrically connected with the TFT;

wherein the connecting electrode comprises a filling part that is received in and completely fills up the contact hole to be electrically connected with the TFT and a projecting part that is formed on a top surface of the flat layer such that a bottom surface of the projecting part is in contact with and supported on the top surface of the flat layer, the projecting part having a top surface spaced from the bottom surface thereof and a circumferential surface connected between the top and bottom surfaces thereof; the projecting part is located exactly under the anode that is laid directly on the top surface of the flat layer, the anode having a portion extending along and in direct contact with and covering the top surface and the circumferential surface of the projecting part of the connecting electrode so as to have the top surface and the circumferential surface of the projecting part of the connecting electrode completely covered and enclosed by the portion of the anode, while a remaining portion of the anode is located directly on the top surface of the flat layer; and wherein material of the connecting electrode is a stack combination of one or more of molybdenum, aluminum, titanium and copper.

10. The OLED display substrate according to claim 9, wherein the TFT comprises a buffer layer located on the substrate, a channel area and a semiconductor layer located in a source area and a drain area respectively at two sides of the channel area on the buffer layer, a gate isolation layer located on the semiconductor layer, a gate located above the channel area and on the gate isolation layer, an interlayer insulation layer on the gate, a source located in the source area and penetrating the gate isolation layer and the interlayer insulation layer and a drain located in the drain area and penetrating the gate isolation layer and the interlayer insulation layer.

11. The OLED display substrate according to claim 10, wherein the contact hole exposes a partial surface of the drain, and the filling part of the connecting electrode contacts the drain of the TFT via the contact hole, and electrically connected to the drain of the TFT.

\* \* \* \* \*